(12) United States Patent
Wakaki (10) Patent No.: US 9,985,189 B2
(45) Date of Patent: May 29, 2018

(54) SEMICONDUCTOR DEVICE

(71) Applicant: NICHIA CORPORATION, Anan-shi, Tokushima (JP)

(72) Inventor: Ryosuke Wakaki, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days. days.

(21) Appl. No.: 15/158,139

(22) Filed: May 18, 2016

(65) Prior Publication Data
US 2016/0343915 A1    Nov. 24, 2016

(30) Foreign Application Priority Data

May 19, 2015   (JP) .................................. 2015-102078

(51) Int. Cl.
| | | |
|---|---|---|
| H01L 33/00 | (2010.01) | |
| H01L 33/62 | (2010.01) | |
| H05K 1/11 | (2006.01) | |
| H02K 3/34 | (2006.01) | |
| H05K 3/34 | (2006.01) | |

(52) U.S. Cl.
CPC .............. *H01L 33/62* (2013.01); *H05K 1/111* (2013.01); *H05K 3/3442* (2013.01); *H05K 2201/09736* (2013.01); *H05K 2201/09745* (2013.01); *H05K 2201/10636* (2013.01); *Y02P 70/611* (2015.11)

(58) Field of Classification Search
CPC ....... H01L 33/483; H01L 33/24; H01L 33/62; H05K 1/111; H05K 3/3442; H05K 2201/09736; H05K 2201/010636; H05K 2201/09745; H05K 2201/10636; Y02P 70/611

USPC .......................................................... 257/99
See application file for complete search history.

(56) References Cited

FOREIGN PATENT DOCUMENTS

| | | |
|---|---|---|
| JP | H05-021523 A | 1/1993 |
| JP | H11-017326 A | 1/1999 |
| JP | 2000-151060 A | 5/2000 |
| JP | 2004-228364 A | 8/2004 |
| JP | 2005-012155 A | 1/2005 |
| JP | 2006-032511 A | 2/2006 |
| JP | 2008-140596 A | 6/2008 |
| JP | 2011-151368 A | 8/2011 |
| JP | 2012-212794 A | 11/2012 |
| JP | 2013-243229 A | 12/2013 |
| JP | 5381987 B2 | 1/2014 |
| WO | WO-2010/008033 A1 | 1/2010 |

OTHER PUBLICATIONS

NPL Machine Translation JP 2011-151368.*
NPL Machine Translation JP 2012-212794.*
Simpson and Weiner, "The Oxford English Dictionary", 1989, Clarendon Press, V 20.*

* cited by examiner

*Primary Examiner* — Mohsen Ahmadi
*Assistant Examiner* — Patricia Reddington
(74) *Attorney, Agent, or Firm* — Foley & Lardner LLP (57) ABSTRACT

A semiconductor device includes a mounting substrate with a land having a first surface and a second surface higher than the first surface, a side-emission type light emitting device including an external connecting terminal disposed on the first surface, and a bonding member disposed at least on the second surface to bond the external connecting terminal and the land.

22 Claims, 11 Drawing Sheets

SEMICONDUCTOR DEVICE

CROSS-REFERENCE TO RELATED PATENT APPLICATION

The present application claims priority under 35 U. S. C. § 119 to Japanese Patent Application No. 2015-102078, filed May 19, 2015. The entire disclosure of Japanese Patent Application No. 2015-102078 is incorporated herein by reference.

BACKGROUND

The present disclosure relates to a semiconductor device.

A semiconductor device including a light emitting device mounted on a land pattern on a mounting substrate has been known (for example, see JP 2006-32511A, JP 2008-140596A, JP 2012-212794A, and JP 2013-243229A).

In such semiconductor devices, sufficient bonding strength between the light emitting device and the land pattern may not be obtained.

SUMMARY

A semiconductor device includes a mounting substrate with a land having a first surface and a second surface higher than the first surface, a side-emission type light emitting device including an external connecting terminal disposed on the first surface, and a bonding member disposed at least on the second surface to bond the external connecting terminal and the land.

In the semiconductor device described above, the bonding strength between the light emitting device and the land can be enhanced.

DETAILED DESCRIPTION OF EMBODIMENTS

Light Emitting Device According to First Embodiment

Figure 1:
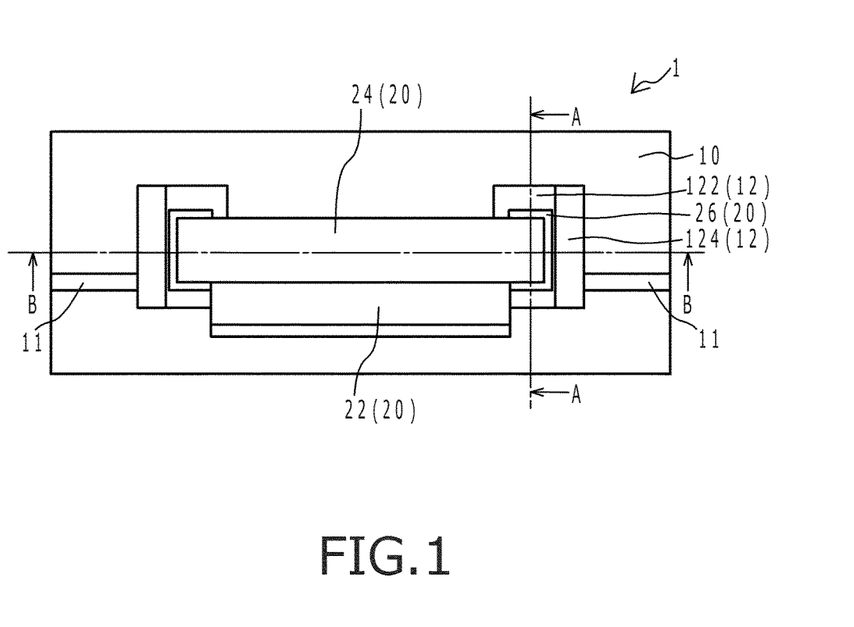
FIG. 1 is a schematic plan view of a semiconductor device according to a first embodiment of the present disclosure.
Figure 2:
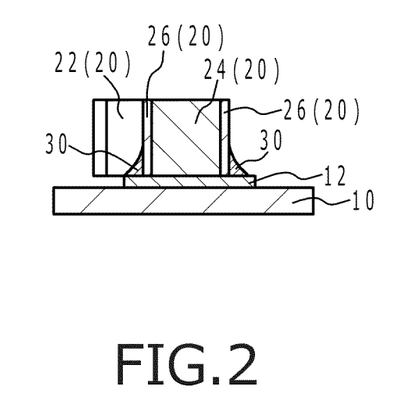
FIG. 2 is a cross sectional view taken along line A-A in FIG. 1.
Figure 3:
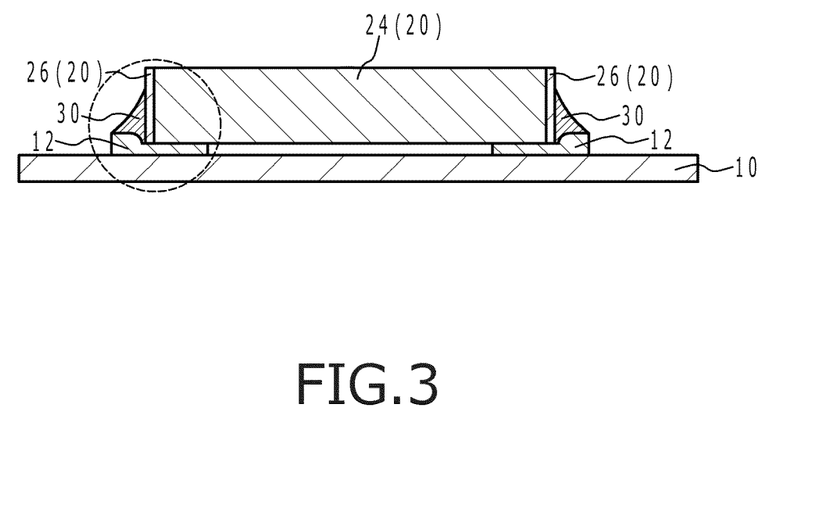
FIG. 3 is a cross sectional view taken along line B-B in FIG. 1.
Figure 4:
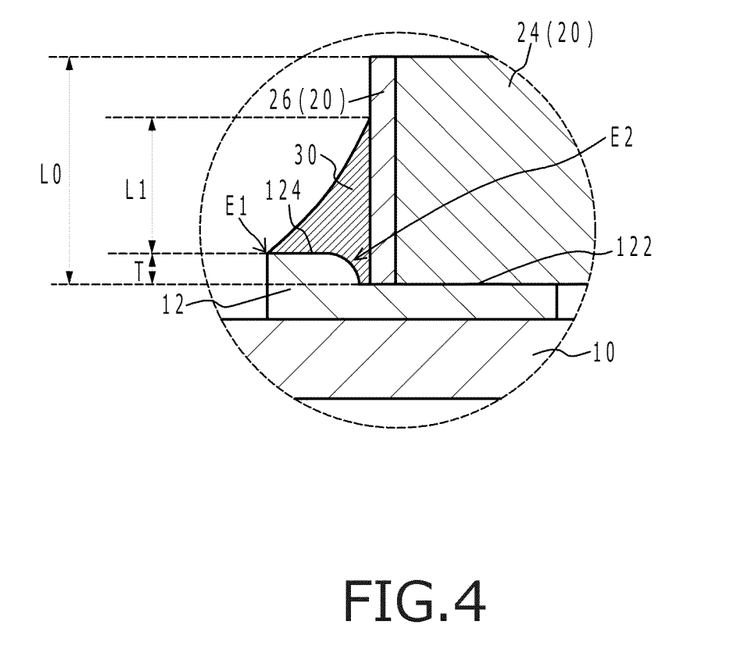
FIG. 4 is an enlarged view of a part enclosed in a dotted line in FIG. 3.

FIG. 1 is a schematic plan view of a semiconductor device according to a first embodiment of the present disclosure. FIG. 2 is a cross sectional view taken along line A-A in FIG. 1. FIG. 3 is a cross sectional view taken along line B-B in FIG. 1. FIG. 4 is an enlarged view of a part enclosed in a dotted line in FIG. 3. For easy understanding, the bonding member 30 is not shown in FIG. 1. As shown in FIG. 1 to FIG. 4, a semiconductor device 1 according to a first embodiment includes a mounting substrate 10, a light emitting device 20, and a bonding member 30. The mounting substrate 10 is provided with lands 12 each having a first surface 122 and a second surface 124 higher than the first surface 122. The light emitting device can be of a side-emission type. The light emitting device 20 includes external connecting terminals 26 disposed on the first surfaces 122 respectively. The bonding member 30 is disposed at least on each of the second surfaces 124 to bond the external connecting terminal 26 and the land 12. Major components will be described below.

In the implementations described below, a forward of a direction in parallel to an optical axis of the light emitting device 20 is a front side, a backward of a direction opposite to it is a back side, and a direction perpendicular to the optical axis of the light emitting device 20 is a lateral direction, respectively in a plan view of the semiconductor device 1.

Mounting Substrate 10

The mounting substrate 10 includes a base member formed in a plate shape made of glass epoxy resin, ceramic, polyimide, or the like. The mounting substrate 10 is also provided with lands 12 and wiring patterns 11 made of copper, gold, silver, nickel, palladium, tungsten, chromium, titanium, or an alloy thereof. The surfaces of the lands 12 are preferably made of gold, silver, or an alloy thereof, in view of wettability of the bonding member 30. The lands 11 are electrically connected to the wiring patterns 11 and the wiring patterns 11 are electrically connected to the external connecting terminals or the like, respectively. The number of the lands 12 can be appropriately selected, but a same number as the external connecting terminals 26 is preferable. In the first embodiment, two external connecting terminals 26 are used, so that two lands 12 are employed. The lands 12 and the wiring patterns 11 can be formed by using a method such as plating, laminating and pressure-bonding, pasting, sputtering, vapor deposition, etching, or the like.

The land 12 has a step. A first surface 122 is formed on a lower side of the step and a second surface 124 higher than the first surface 122 is formed on an upper side of the step. As described above, the first surface 122 and the second surface 124 are continuous with the step and the second surface 124 is higher than the first surface 122.

The edge E1 of the second surface 124 opposite to the first surface 122 may be a curved surface, but the edge E1 preferably has an angular cross section. With the angular side edge E1, the bonding member 30 in a molten state can be easily held on the second surface 124 by surface tension, so that more bonding member 30 can be disposed at the light emitting device 20 (external connecting terminals 26) side. Accordingly, the bonding strength between the light emitting device 20 (external connecting terminal 26) and the bonding member 30 can be further enhanced.

The second surface 124 is arranged, for example, at each lateral side of the light emitting device 20 in a plan view. With this arrangement, an outer lateral surface of each of the external connecting terminals 26 can be covered by the bonding member 30, and a side fillet is formed on the outer lateral surface of each of the external connecting terminals 26.

Light Emitting Device 20

For the light emitting device 20, for example, a side-emission type (also referred to as a "side-view type") light emitting device can be used. More specifically, the light emitting device 20 includes a light emitting part 22 having a semiconductor light emitting element, a sealing member (including a wavelength converting layer, a light reflecting layer, or the like) and an arrangement part 24 including a package base and lead electrodes, and external connecting terminals 26. The light emitting part 22 is arranged on a front side of the arrangement part 24. For the light emitting device 20, a top-emission type (also referred to as a "top-view type") light emitting device can also be used. In the case of a top-emission type light emitting device, the light emitting part 22 is arranged on an upper surface of the arrangement part 24.

The external connecting terminal 26 is disposed at least one end (one lateral side) of the arrangement part 24, and preferably disposed at each side (each lateral side) of the arrangement part 24. Disposing of the external connecting terminal 26 at each side of the arrangement part 24 can increase the bonding area between the light emitting device 20 (i.e., external connecting terminals 26) and the bonding member 30, which can further enhance their bonding strength. The first embodiment exemplifies a configuration in which the external connecting terminal 26 is disposed on each end of the arrangement part 24 in a C-shape in a plan view, that is, the external connecting terminals are disposed along the front surface and the lateral surface to the back surface of the arrangement part 24, respectively. The external connecting terminals 26 disposed at the both sides of the arrangement part 24 are arranged on the first surface 122. The external connecting terminal 26 can be made of copper, iron, gold, silver, aluminum, palladium, nickel, an alloy of those, or the like. The surface of the external connecting terminal 26 is preferably made of gold, silver, or an alloy of those, in view of wettability of the bonding member 30.

Bonding Member 30

The bonding member 30 is made of a soldering material, for example. The bonding member 30 bonds the external connecting terminals 26 and the land 12 so as to partially cover the external connecting terminals 26. The bonding member 30 is disposed at least on the second surface 124, but preferably disposed continuously on the first surface 122 and the second surface 124. With this arrangement, the bonding area between the light emitting device 20 (i.e., external connecting terminals 26) and the bonding member 30 can be expanded toward a lower side of the light emitting device 20 (i.e., external connecting terminals 26), so that the bonding strength of those can be further enhanced. In the case of forming an end E2 of the second surface 124 at the first surface 122 side in a curved surface, the bonding member 30 in a molten state can be easily spread on the first surface 122 and the second surface 124 over the step, which facilitates disposing the bonding member 30 on the first surface 122 and the second surface 124.

Difference in Height

The difference L0 in height between the first surface 122 and an upper surface of the light emitting device 20 can be appropriately set, but is preferably in a range of 0.1 mm to 0.8 mm, more preferably in a range of 0.2 mm to 0.4 mm. The difference L1 in height between the second surface 124 and an uppermost of the bonding member 30 can be appropriately set, but is preferably in a range of 0.09 mm to 0.5 mm, more preferably in a range of 0.1 mm to 0.3 mm. Also, the difference T in height between the first surface 122 and the second surface 124 can be appropriately set, but is preferably in a range of 0.01 mm to 0.3 mm, more preferably in a range of 0.015 mm to 0.08 mm.

In the semiconductor device 1 according to the first embodiment described above, the land 12 has the first surface 122 and the second surface 124 higher than the first surface 122, and the bonding member 30 is disposed on the second surface 124. Thus, compared to the case where the bonding member 30 is disposed on a flat land, the surfaces of the external connecting terminals 26 can be covered by the bonding member 30 to a higher portion. Accordingly, the bonding strength between the light emitting device 20 and the land 12 can be improved. Also, the light emitting device 20 can be mounted accurately at a desired position and orientation.

Light Emitting Device 2 According to Second Embodiment

Figure 5:
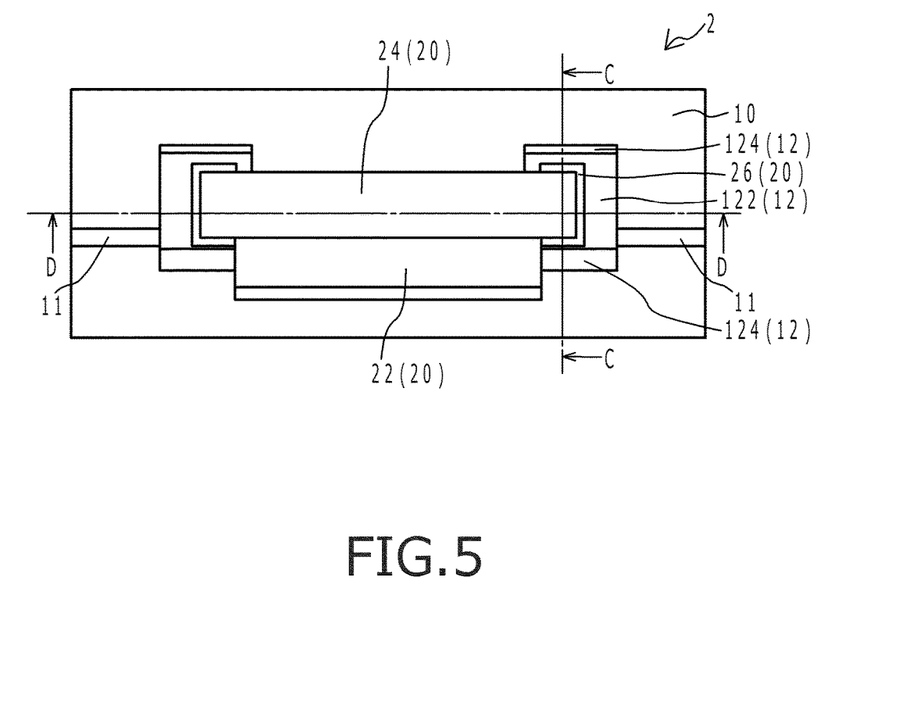
FIG. 5 is a cross-sectional view of a semiconductor laser device according to a second embodiment of the disclosure.
Figure 6:
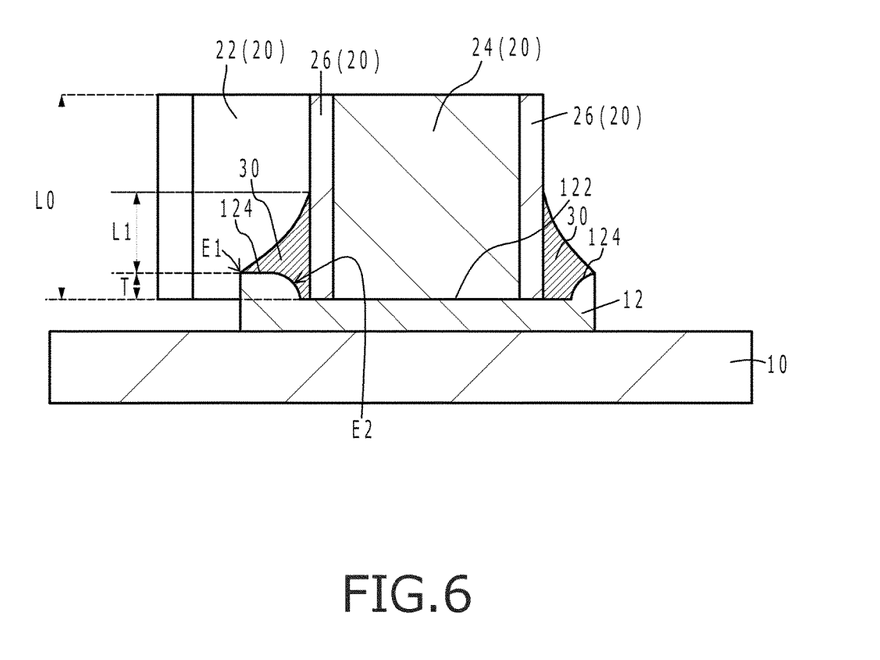
FIG. 6 is an enlarged view of a cross section taken along line C-C in FIG. 5.
Figure 7:
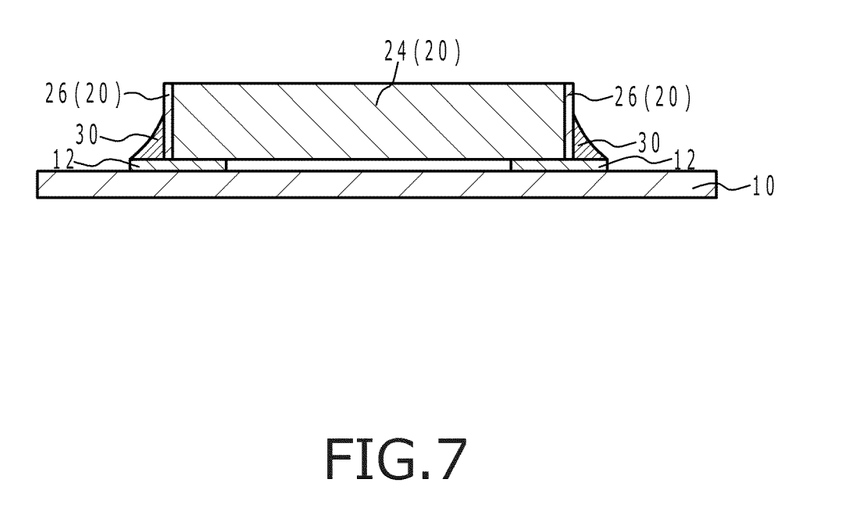
FIG. 7 is a cross sectional view taken along line D-D in FIG. 5.

FIG. 5 is a schematic plan view of a semiconductor device according to a second embodiment of the present disclosure. FIG. 6 is an enlarged view of a cross section taken along line C-C in FIG. 5. FIG. 7 is a cross sectional view taken along line D-D in FIG. 1. In FIG. 5, for the sake of easy understanding, the bonding member 30 is not shown. As shown in FIG. 5 to FIG. 7, the semiconductor device 2 according to the second embodiment differs from the semiconductor device 1 according to the first embodiment in which, in a plan view, the second surface 124 is provided at the front side of the light emitting device 20 and at the back side of the light emitting device 20. In the semiconductor device 2 according to the second embodiment, the light emitting device 20 is pulled from its both the front side and the back side by the bonding member 30 disposed at the front side and the back side of the light emitting device 20, so that the light emitting device 20 can be mounted more accurately at a desired position and orientation.

Further, in the semiconductor device 2 according to the second embodiment, an area of the second surface 124 at the front side of the light emitting device 20 is preferably larger than an area of the second surface 124 at the back side of the light emitting device 20. With this arrangement, a larger amount of the bonding member 30 can be disposed at the front side than the back side of the light emitting device 20, so that the light emitting device 20 can be pulled toward the front side of the light emitting device 20. Accordingly, positioning of the light emitting device 20 can be performed by using the step formed at the front side of the light emitting device 20. Moreover, the light emitting device 20 can be mounted more accurately at a desired position and orientation. Further, in the case where the semiconductor device 2 has a plurality of light emitting devices 20, the light emitting devices 20 can be aligned with the position of the step.

Light Emitting Device 3 According to Third Embodiment

Figure 8:
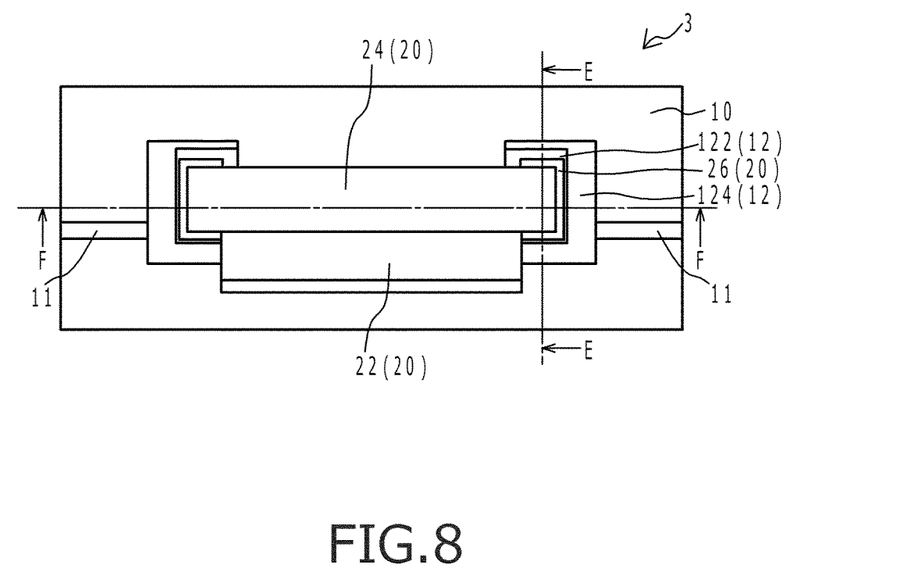
FIG. 8 is a schematic plan view of a semiconductor device according to a third embodiment of the disclosure.
Figure 9:
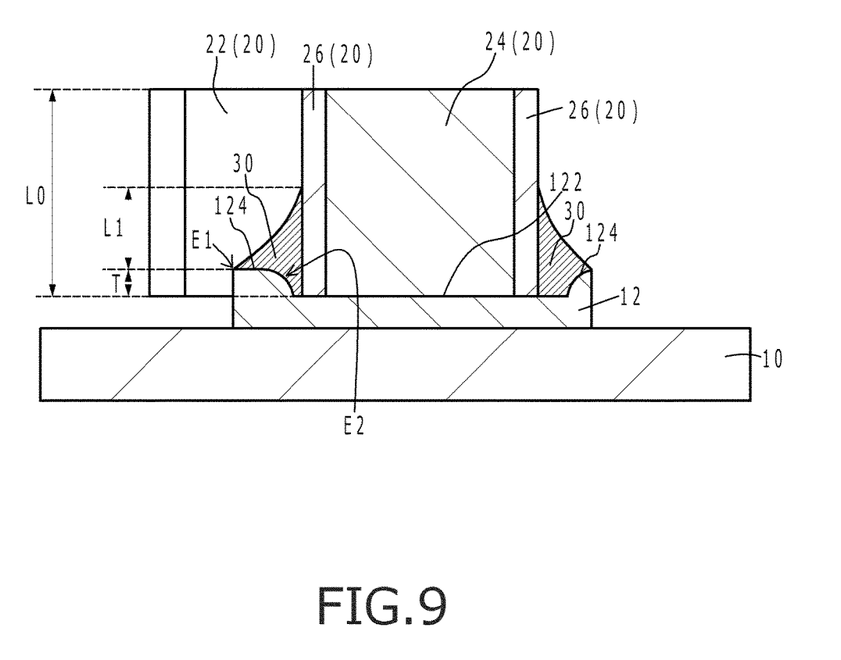
FIG. 9 is an enlarged view of a cross section taken along line E-E in FIG. 8.
Figure 10:
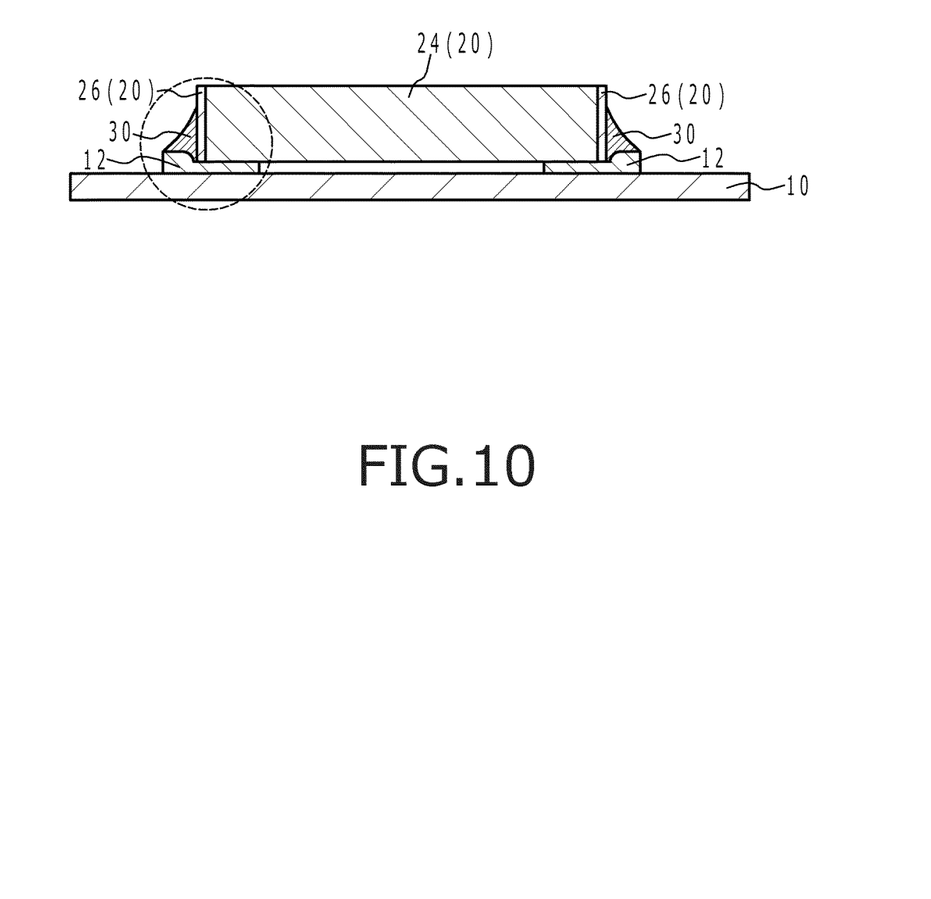
FIG. 10 is a cross sectional view taken along line F-F in FIG. 8.
Figure 11:
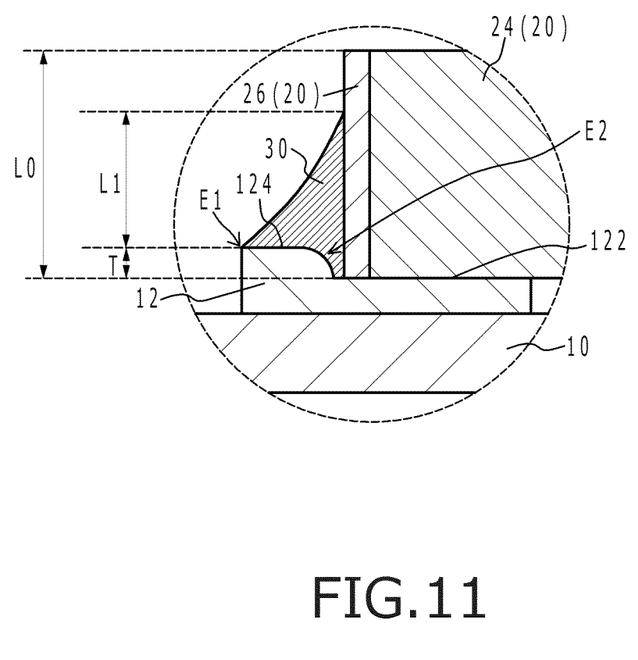
FIG. 11 is an enlarged view of a part enclosed in a dotted line in FIG. 10.

FIG. 8 is a schematic plan view of a semiconductor device according to a third embodiment of the disclosure. FIG. 9 is an enlarged view of a cross section taken along line E-E in FIG. 8. FIG. 10 is a cross sectional view taken along line F-F in FIG. 8. FIG. 11 is an enlarged view of a part enclosed in a dotted line in FIG. 10. In FIG. 8, for the sake of easy understanding, the bonding member 30 is not shown. As shown in FIG. 9 to FIG. 11, the semiconductor device 3 according to the third embodiment differs from the semiconductor device 1 according to the first embodiment in which, the second surface 124 has a C-shape in a plan view. In the semiconductor device 3 according to the third embodiment, the external connecting terminals 26 can be surrounded by the bonding member 30 in a C-shape, so that the light emitting device 20 can be mounted more accurately at a desired position and orientation.

Other Embodiments

As shown in the above, a semiconductor device is illustrated in accordance with the first to third embodiments, but an appropriate position and shape of the second surface 124 in a plan view other than those shown in the embodiments may also be employed. The second surface 124 can be formed at various positions and in various shapes.

Example 1

In Example 1, a semiconductor device 2 according to the second embodiment has a difference L0 in height between the first surface 122 and the upper surface of the light emitting device 20 of 0.3 mm, a difference L1 in height between the second surface 124 and the uppermost of the bonding member 30 of 0.1 mm, and a difference T in height between the first surface 122 and the second surface 124 of 0.018 mm. In this case, assuming that a stress P of 10N is generated on the uppermost of the light emitting device 20, the value of a moment M1 that is generated centering the lowermost of the light emitting device 20 and is applied to the uppermost of the light emitting device 20 can be calculated as below.

$$M1=P\times(L0-L1-T)=1.82\times10^{-3}\text{ Nm}$$

Example 2

In Example 2, a semiconductor device 2 according to the second embodiment has a difference L0 in height between the first surface 122 and the upper surface of the light emitting device 20 of 0.3 mm, a difference L1 in height between the second surface 124 and the uppermost of the bonding member 30 of 0.1 mm, and a difference T in height between the first surface 122 and the second surface 124 of 0.035 mm. In this case, assuming that a stress P of 10N is generated on the uppermost of the light emitting device 20, the value of a moment M1 that is generated centering the lowermost of the light emitting device 20 and is applied to the uppermost of the light emitting device 20 can be calculated as below.

$$M1=P\times(L0-L1-T)=1.65\times10^{-3}\text{ Nm}$$

Example 3

In Example 3, a semiconductor device 2 according to the second embodiment has a difference L0 in height between the first surface 122 and the upper surface of the light emitting device 20 of 0.3 mm, a difference L1 in height between the second surface 124 and the uppermost of the bonding member 30 of 0.1 mm, and a difference T in height between the first surface 122 and the second surface 124 of 0.053 mm. In this case, assuming that a stress P of 10N is generated on the uppermost of the light emitting device 20, the value of a moment M1 that is generated centering the lowermost of the light emitting device 20 and is applied to the uppermost of the light emitting device 20 can be calculated as below.

$$M1=P\times(L0-L1-T)=1.47\times10^{-3}\text{ Nm}$$

Example 4

In Example 4, a semiconductor device 2 according to the second embodiment has a difference L0 in height between the first surface 122 and the upper surface of the light emitting device 20 of 0.3 mm, a difference L1 in height between the second surface 124 and the uppermost of the bonding member 30 of 0.1 mm, and a difference T in height between the first surface 122 and the second surface 124 of 0.07 mm. In this case, assuming that a stress P of 10N is generated on the uppermost of the light emitting device 20, the value of a moment M1 that is generated centering the lowermost of the light emitting device 20 and is applied to the uppermost of the light emitting device 20 can be calculated as below.

$$M1=P\times(L0-L1-T)=1.30\times10^{-3}\text{ Nm}$$

Comparative Example

In Comparative Example, a semiconductor device has a configuration similar to that of the semiconductor device 2 according to the second embodiment except that the second surface 124 is not provided, and has a difference L0 in height between the first surface 122 and the upper surface of the light emitting device 20 of 0.3 mm. In this case, assuming that a stress P of 10N is generated on the uppermost of the light emitting device 20, the value of a moment M0 that is generated centering the lowermost of the light emitting device 20 and is applied to the uppermost of the light emitting device 20 can be calculated as below.

$$M0=P\times(L0-L1-T)=2.00\times10^{-3}\text{ Nm}$$

Comparison

The results of comparison of Examples 1 to 4 and Comparative Example are shown in Table 1.

TABLE 1

| | T (mm) | M0 | M1 | M1/M0 | Rate of Decrease of Moment |
|---|---|---|---|---|---|
| Example 1 | 0.018 | 0.2 | 0.182 | 0.91 | 9 |
| Example 2 | 0.035 | 0.2 | 0.165 | 0.825 | 17.5 |
| Example 3 | 0.053 | 0.2 | 0.147 | 0.735 | 26.5 |
| Example 4 | 0.07 | 0.2 | 0.13 | 0.65 | 35 |

The results indicate that a reduction in the moment compared to that of Comparative Example is 9% in Example 1, 17.5% in Example 2, 26.5% in Example 3, and 35% in Example 4. Accordingly, it is shown that having the second surface 124 higher than the first surface 122 can enhance the bonding strength between the light emitting device 20 and the land 12 and thus increases the stability of the semiconductor device 2. Further, it is shown that the greater the difference in height between the first surface 122 and the second surface 124, the greater the bonding strength between the light emitting device 20 and the land 12, and thus increases the stability of the semiconductor device 2.

As shown in the above, embodiments are illustrated by way of example, but the scope of the invention is not limited thereto.

What is claimed is:

1. A semiconductor device comprising:
   a mounting substrate comprising a land having a first surface and a second surface at a position higher than the first surface;
   a side-emission type light emitting device including an external connecting terminal disposed on and in direct contact with the first surface; and
   a bonding member disposed at least on the second surface to bond the external connecting terminal and the land, wherein the second surface of the land is at a position higher than a lower surface of the side-emission type light emitting device.

2. The semiconductor device according to claim 1, wherein in a plan view, the second surface is on a lateral side of the light emitting device.

3. The semiconductor device according to claim 1, wherein in a plan view, the second surface is provided at the front side of the light emitting device and at the back side of the light emitting device.

4. The semiconductor device according to claim 3, wherein an area of the second surface at the front side of the light emitting device is larger than an area of the second surface at the back side of the light emitting device.

5. The semiconductor device according to claim 1, wherein the second surface has a C-shape in a plan view.

6. The semiconductor device according to claim 1, wherein an edge of the second surface opposite to the first surface is angular in cross section.

7. The semiconductor device according to claim 1, wherein the bonding member is disposed continuously on the first surface and the second surface.

8. The semiconductor device according to claim 7, wherein an edge of the second surface at the first surface side has a curved shape.

9. The semiconductor device according to claim 2, wherein in a plan view, the second surface is provided at the front side of the light emitting device and at the back side of the light emitting device.

10. The semiconductor device according to claim 9, wherein an area of the second surface at the front side of the light emitting device is larger than an area of the second surface at the back side of the light emitting device.

11. The semiconductor device according to claim 10, wherein the second surface has a C-shape in a plan view.

12. The semiconductor device according to claim 11, wherein an edge of the second surface opposite to the first surface is angular in cross section.

13. The semiconductor device according to claim 12, wherein the bonding member is disposed continuously on the first surface and the second surface.

14. The semiconductor device according to claim 13, wherein an edge of the second surface at the first surface side has a curved shape.

15. The semiconductor device according to claim 7, wherein in a plan view, the second surface is provided at a lateral side of the light emitting device.

16. The semiconductor device according to claim 15, wherein in a plan view, the second surface is provided at the front side of the light emitting device and at the back side of the light emitting device.

17. The semiconductor device according to claim 16, wherein an area of the second surface at the front side of the light emitting device is larger than an area of the second surface at the back side of the light emitting device.

18. The semiconductor device according to claim 7, wherein the second surface has a C-shape in a plan view.

19. The semiconductor device according to claim 15, wherein the second surface has a C-shape in a plan view.

20. The semiconductor device according to claim 17, wherein the second surface has a C-shape in a plan view.

21. A semiconductor device comprising:
a mounting substrate comprising a land having a first surface and a second surface at a position higher than the first surface;
a side-emission type light emitting device including an external connecting terminal disposed on and in direct contact with the first surface; and
a bonding member disposed at least on the second surface to bond the external connecting terminal and the land.

22. A semiconductor device comprising:
a mounting substrate comprising:
a plate-shaped base member, and
a land having a first surface and a second surface at a position higher than the first surface,
wherein the land is located above the plate-shaped base member;
a side-emission type light emitting device including an external connecting terminal disposed on and in direct contact with the first surface; and
a bonding member disposed at least on the second surface to bond the external connecting terminal and the land.

* * * * *